United States Patent [19] [11] 4,019,094
Dinger et al. [45] Apr. 19, 1977

[54] STATIC CONTROL SHORTING CLIP FOR SEMICONDUCTOR PACKAGE

[75] Inventors: Edward H. Dinger; David G. Saben; John R. VanPatten, all of Waynesboro, Va.

[73] Assignee: General Electric Company, Salem, Va.

[22] Filed: Dec. 19, 1975

[21] Appl. No.: 642,349

[52] U.S. Cl. .............................. 361/220; 206/331; 339/19
[51] Int. Cl.² .......................................... H05F 3/02
[58] Field of Search ............ 317/2 R, 16; 206/328, 206/329, 331; 339/17 CF, 174, 19, 176 MP, 91 R, 75 MP

[56] References Cited

UNITED STATES PATENTS

| 3,594,714 | 7/1971 | Paullus et al. | 339/19 X |
|---|---|---|---|
| 3,648,108 | 3/1972 | Bailey | 317/2 R |
| 3,653,498 | 4/1972 | Kisor | 206/46 H |
| 3,701,071 | 10/1972 | Landman | 339/91 R X |
| 3,701,077 | 10/1972 | Kelly, Jr. | 339/75 MP X |
| 3,746,157 | 7/1973 | Ianson | 339/17 CF X |
| 3,774,075 | 11/1973 | Medesha | 317/2 R |
| 3,784,960 | 1/1974 | Bruckner | 339/91 R |
| 3,825,876 | 7/1974 | Damon et al. | 206/328 X |
| 3,892,312 | 7/1975 | Tems | 339/17 CF X |
| 3,908,153 | 9/1975 | Cason, Jr. | 317/2 R |

OTHER PUBLICATIONS

I.B.M. Technical Disclosure Bulletin, vol. 17, No. 6, 11–74, "Protective Module Cover".

Primary Examiner—J D Miller
Assistant Examiner—Patrick R. Salce
Attorney, Agent, or Firm—Arnold E. Renner; Philip L. Schlamp

[57] ABSTRACT

A shorting clip, for use with a semiconductor package, for shorting the several package leads comprises a conductive member having leg portions to electrically contact each of the leads of the package. Retaining means cooperating with resilient means operative to bias the package and clip apart serve to maintain the clip-package assembly in positive registration.

12 Claims, 4 Drawing Figures

STATIC CONTROL SHORTING CLIP FOR SEMICONDUCTOR PACKAGE

BACKGROUND OF THE INVENTION

The present invention relates generally to semiconductor devices and more particularly to a clip assembly for attachment to a semiconductor package to electrically short circuit the leads of the package and thereby prevent the buildup of a static charge on the active elements of he semiconductor which might cause damage thereto.

Semiconductor integrated circuits such as MOS and C-MOS circuits are known to be particularly susceptible of damage from very small static electrical charges. Such circuits are normally placed inside an insulating package, usually in the shape of a rectangular solid and are provided with a plurality of leads extending from the sides of the package by means of which electrical connections are made to the circuit. These leads usually extend from the package in a direction susbstantially normal to the major plane thereof and are adapted for insertion into circuit boards for soldering and/or other assembly operations.

The susceptibility of these integrated circuits poses a handling problem particularly in the assembly of the packages onto circuit boards. If a worker's body has accumulated a static charge and the worker picks up an unprotected circuit package, the likelihood of internal damage to the intergrated circuit is very great. Such a damage circut or "chip" is not normally discovered until test after the assembly operation has been completed. If discovery is not made until such time, considerable extra work is reguired to remove the "soldered in place" device and replace it.

Integrated circuits of this nature are often shipped by their manufacturer with their connection pins pressed into a piece of conductive plastic. This quite effectively shorts all the pins together and prevents any static buildup between the circuit elements during shipment. There comes, however, a time when the chip must be removed from the manufacturer's shipping protection for assembly onto the board.

To reduce the possibility of damage through static charge, elaborate measures are taken in the assembly operation. Workers are often required to wear special static-free clothing and work in an atmospherically controlled room. In addition, workbenches are grounded and the workers are sometimes "handcuffed". By handcuffed it is meant that the worker must wear a grounding braclet, when he or she is at his work station, which consists of a snug fitting conductor around each wrist. The braclet is connected by suitable means such as a braided grounding strap to the grounded workbench. When the chips are moved from one work area to another, they are often sealed in foil lined bags. All of these restrictions are, at best, bothersome in that they restrict the worker's mobility and tend to diminish his effectiveness. In addition, such requirements represent considerable extra costs to the assembly operation.

Shorting clips or devices for shorting the several leads of the semiconductor package together are known in the art. Known shorting clips, however, all suffer from one or more of several defects including a structure which does not insure positive registration or electrical contact with each of the leads, a complex structure which must be removed prior to final assembly onto the printed wiring board, a failure to provide a secure and positive registration between the clip and the package and a repositioning of the clip before the chip can be placed on the printed wiring board.

SUMMARY OF THE INVENTION

It is, therefore, an object of the present invention to provide an improved shorting clip for a semiconductor package.

Another object is to provide a shorting clip for a semiconductor package which is easily attached and detached and which can remain in place throughout an assembly process including soldering of the package onto a printed wiring board.

Still another object is to provide a semiconductor package shorting clip for retention with the package during the manufacturing process which clip insures electrical contact with each of the packaged leads and which clip is held in positive registration with respect to the package.

It is a further object to provide a semiconductor package shorting clip which employs resilient means to maintain positive registration between the clip and the package.

A still further object is to provide a resiliently retained semiconductor shorting clip which is made of electrically conductive material and which provides individual fingers to contact each of the package leads to thereby insure the shorting together of each of the leads.

A further object is to provide a shorting clip for a semiconductor package which is resiliently maintained in positive registraton with the package and which leaves the lower ends of the package leads free such that the clip may remain on the package throughout normal handling and assembly operations.

An additional object is to provide a shorting clip, for a semiconductor package, which is of minimum size and which offers minimum obstruction to assembly of the package into larger assemblies.

The foregoing and other objects are satisfied in accordance with the present invention by providing a shorting clip having a top portion dimensioned to overlay the top major surface of the semiconductor package body which clip further includes a pair of leg portions of electrically conductive material in electrical circuit with one another. The leg portions are adapted to resiliently engage and contact each of the leads extending from the package body. Retaining means are provided to grasp the underside of the package body and a resilient biasing means intermediate the top portion of the clip and the semiconductor package body serves to hold the clip in positive registration with the body. In accordance with the preferrred embodiment of the present invention, the leg portions extend only to the upper portion of the semiconductor package leads leaving the lower portions thereof available for assembly operations and are comprised of a plurality of individual fingers independently biased to contact the package leads and thereby insure the shorting together of the leads.

BRIEF DESCRIPTION OF THE DRAWING

While the present invention is particularly defined in the claims annexed to and forming a part of this specification, a better understanding may be had from the following description taken in conjunction with the accompanying drawng in which:

DETAILED DESCRIPTION

Figure 1:
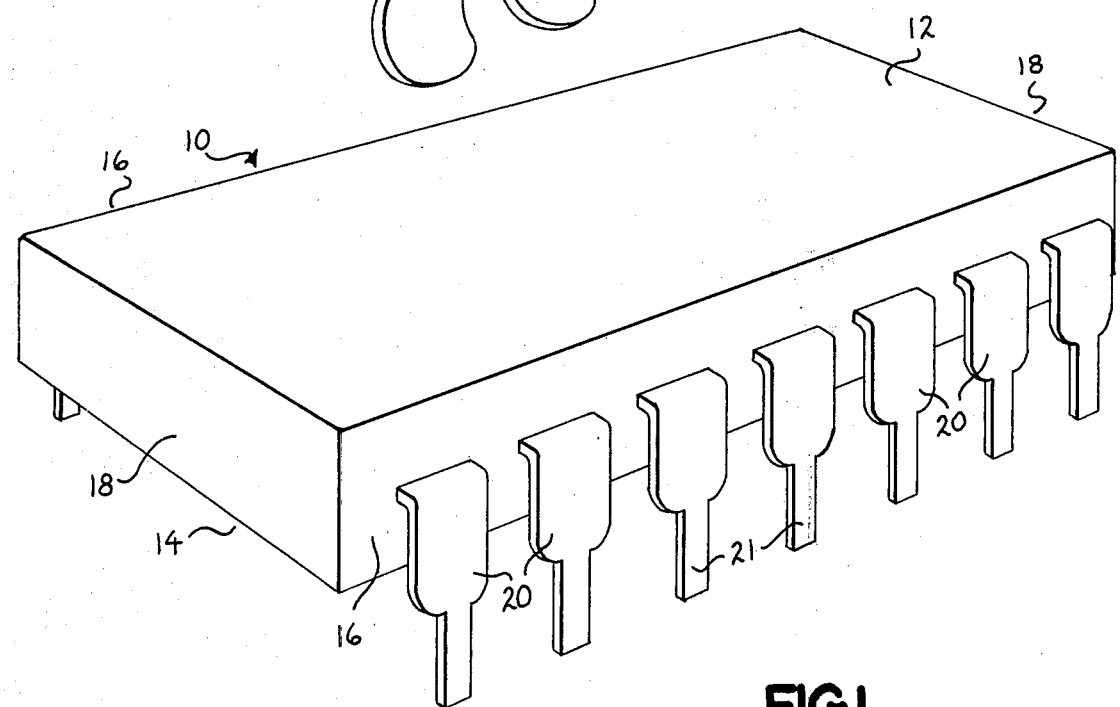
FIG. 1 is an exploded perspective view showing a semiconductor package and the shorting clip of the present invention in its preferred embodiment.
Figure 2:
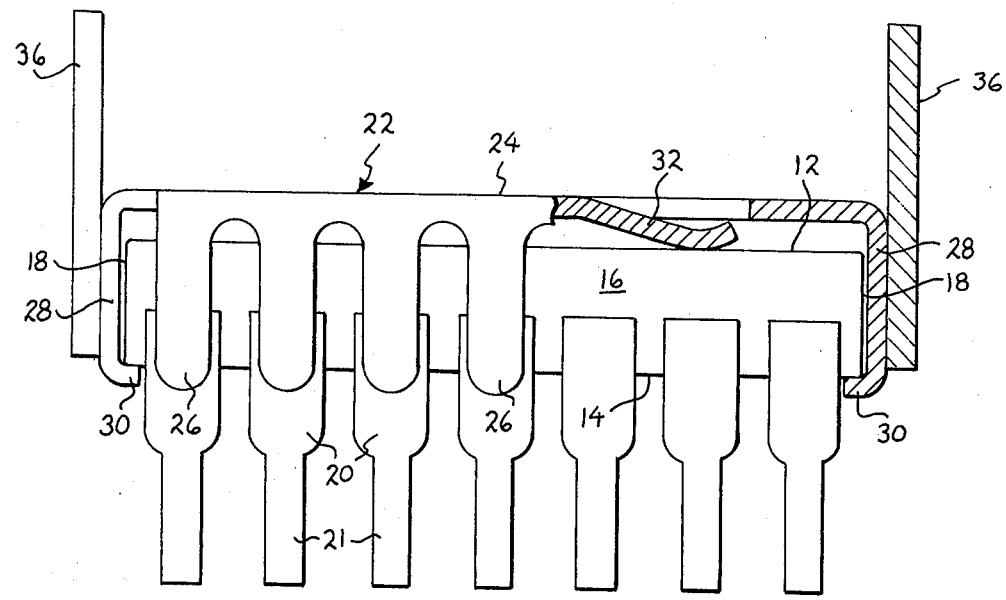
FIG. 2 is a side view partially in section and partially broken away showing a semiconductor package and the shorting clip of the present invention in their assembled position.

Referring now to FIGS. 1 and 2, there is shown a semiconductor package 10 which, as is common in the art, is of a generally rectangular solid configuration and includes a top surface 12, a bottom surface 14, side surfaces 16 and end surfaces 18. The semiconductor circuit itself is disposed within the package 10 the exterior portion of which is normally of an insulating material. Electrical connections to the circuit are by way of a plurality of electrical leads 20 which extend from the side surfaces 16 of the package 10. As illustrated and as is the customary case, the leads 20 emerge from the package approximately midway along the side surface and are bent at an angle with respect to the top and bottom surfaces, this angle normally being approximately 90 degrees.

Figure 3:
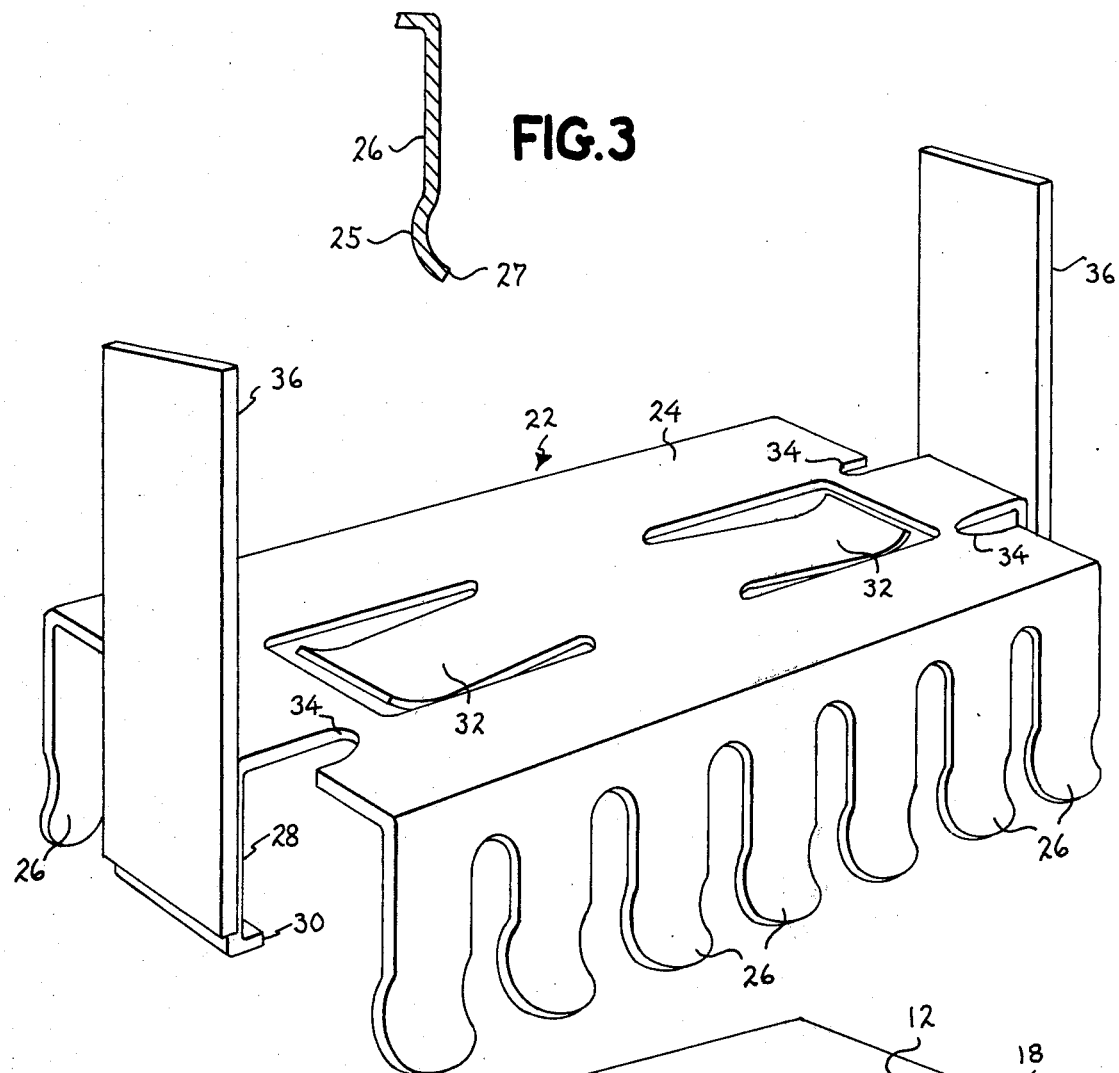
FIG. 3 is a side view showing the profile of the leg portion of the semiconductor clip in its preferred configuration; and, FIG. 4 is a top plan view illustrating a stamping or punching layout which demonstrates how the essential portions of the clip of the present invention may be made in a single stamping to form a unitary structure.

The shorting clip of the present invention is shown generally at 22 and, as will be further explained hereinafter with respect to FIG. 4, may have its basic components or portions made from a single piece of resilient (spring) and electrically conductive material such as a stainless steel, a resilient phosphor bronze or a conductive plastic. As shown, the clip includes a top portion 24 which is dimensioned to overlay the top surface 12 of the package 10. A pair of leg portions depend from the sides of the top portion 24 and are bent at the same angle with respect to that top portion as are the leads 20 of the package 10 with respect to that package. While it is within the concept of the present invention that the two leg portions each be continuous members, in the preferred embodiment each of the leg portions is comprised of a plurality of fingers 26 corresponding in number and position to the leads 20. The length of the leg portions, as best seen in FIG. 2, is such that they extend only to the top parts of the leads 20 so that the lower portions 21 of the leads remain free and uncumbered to facilitate assembly operations such as soldering the package onto a printed wiring board. Each of the fingers 26 is preferably configured to provide a detent 25 with the tip of the leg flared out as at 27 (see especially FIG. 3) to facilitate easy assembly and disassembly of the clip and package. Detent 25 insures good electrical contact between the leg portion or finger and the corresponding lead 20 of the package.

Extending from the top portion 24 at each end corresponding to the end surfaces 18 of the package is a retaining member which includes a downwardly extending portion 28 and an inwardly turned tab portion 30. This assembly is best seen with respect to FIG. 2 which clearly illustrates that the tab portion 30 is designed to engage the bottom surface 14 of the package and thereby secure the clip to the package. To increase the resiliency of the retaining members including the portions 28 and tabs 30, the top portion 24 preferably has cut away portions as illustrated at 34 to thereby reduce the cross-sectional area of this portion and effectively increase the length of the resilient retaining members.

Resilient means, disposed intermediate the top portion 24 of the clip and the top surface 12 of the package, bias the clip and the package apart and enhance the registration of the tab 30 with the bottom surface of the package. In the preferred embodiment, this resilient means includes first and second spring members 32 which are formed integrally with the top portion 24 by removing a substantially U-shaped piece of the top 24 leaving an extending tongue which is then deformed as best shown in the sectional portion of FIG. 2. The resilient means 32 rests against the top surface 12 of the semiconductor package to bias the clip and the package apart. It should be noted that while two such resilient means are illustrated and are included in the preferred embodiment, a single centrally disposed means could be used. It is, however, believed that a single element is less effective in maintaining proper registration between the package and the clip. Other forms of resilient means could also be used.

In order to facilitate the placement and removal of the clip with respect to the semiconductor package, the clip of the present invention, in its preferred embodiment, includes a pair of operating members 36 which need be no more than rectangular members secured to the portions 28 by any suitable means such as spot welding. Thus, an operator may attach or detach the clip from the semiconductor body by grasping the two operating members 36 between his fingers and squeezing them together thus causing the retaining members to be deformed outwardly, releasing tabs 30 from the bottom of the clip and allowing the changing of clip position. It is, of course, to be realized that the operating members 36 are not essential to the present invention but are a simple and expedient means to facilitate the usage of the clip. Other operating means such as a separately operated tool or other forms of levers could be utilized with equal effectiveness. Also, the tabs, if used, could be formed integrally with the portions 28 and 30 by the simple expedient of extending the initial length of this portion and folding the material back upon itself.

Figure 4:
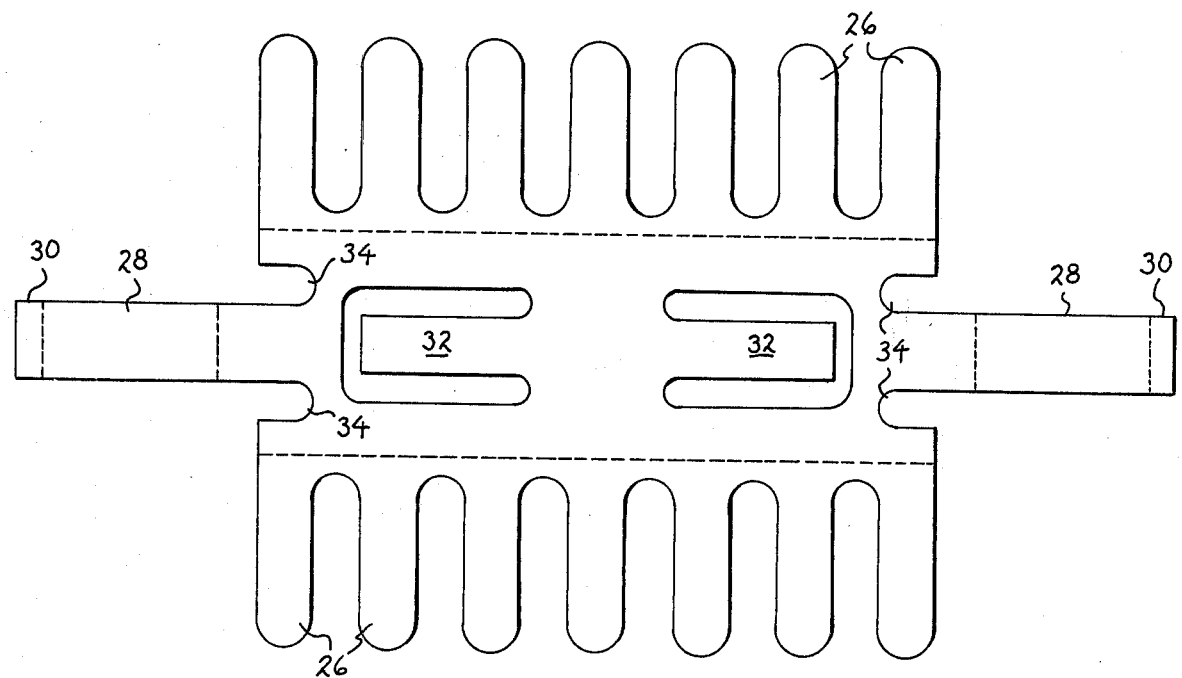

FIG. 4 is included as illustrative of the manner in which the clip of the present invention, excluding the operating members, may be formed from a single sheet of spring material. In view of the foregoing description a detailed description of this drawing is not believed necessary. It should, however, be stated that the broken lines indicate the major lines of bending of the material to form the clip.

Thus, it is seen that there has been provided a shorting clip for a semiconductor package which is easily and inexpensively manufactured and which is readily secured to the package in a positive manner.

While there has been shown and described what is at present considered to be the preferred embodiment of the present invention, modifications thereto will readily occur to those skilled in the art. For example, the possible variations of resilient means between the top portion of the clip and the semiconductor body have been mentioned. It is also apparent that other retaining means to insure registration could be utilized. It is not desired, therefore, that the invention be limited to the specific arrangements shown and described and it is intended to cover in the appended claims all such modifications as fall within the true spirit and scope of the invention.

What is claimed is:

1. A shorting clip for use with a semiconductor package including a substantially flat body defining top, bottom, side and end surfaces and including at least one electrical lead extending from each side surface at an angle with respect to the planes of said top and bottom surfaces, said clip comprising:
   a. a top portion dimensioned to overlay the top surface of said body;
   b. a pair of electrically interconnected leg portions attached to said top portion and adapted to resiliently engage and electrically contact, respectively, the electrical leads extending from said side surfaces;
   c. a retaining member resiliently secured to each end of said top portion, each of said retaining members extending across a respective end surface of said body and adapted for engagement with said bottom surface; and,
   d. resilient means intermediate said top portion and said top surface to bias said portion and said body apart and thereby enhance engagement of said retaining members with said bottom surface.

2. The invention in accordance with claim 1 wherein said clip is formed from a single piece of resilient material of good electrical conductivity.

3. The invention in accordance with claim 1 wherein said leg portions each includes a detent extending longitudinally along the length thereof to enhance electrical contact with the electrical leads.

4. The invention in accordance with claim 1 in which the semiconductor package includes a plurality of electrical leads extending from each side surface and wherein said leg portions each include a plurality of fingers individually spaced to contact individual ones of said leads.

5. The invention in accordance with claim 4 wherein said clip is formed from a single piece of spring material of good electrical conductivity.

6. The invention in accordance with claim 4 wherein each of said fingers includes a detent to enhance engagement with its respective lead.

7. The invention in accordance wth claim 1 wherein said leg portions contact the electrical leads at a position near the semiconductor package body thereby leaving the more remote ends of the leads free for assembly into other apparatus.

8. The invention in accordance with claim 1 further including operating means associated with said retaining members to thereby facilitate the joinder and disjoinder of said clip and said body.

9. The invention in accordance with claim 8 wherein said operating means comprises an upstanding tab associated with each of retaining members.

10. A shorting clip for use with a semiconductor package as described in claim 1 wherein the electrical leads of the package are disposed substantially normal to the planes of the top and bottom surfaces and wherein said leg portions are disposed at substantially ninety degrees to said top portion.

11. The invention in accordance with claim 2 wherein said resilient means are formed integrally with said top portion.

12. A shorting clip for use with a semiconductor package including a substantially flat body defining top, bottom, side and end surfaces and further including a plurality of electrical leads extending from each of the side surfaces at an angle wth respect to the planes of said top and bottom surfaces, said clip comprising:
   a. a top portion of electrically conductive material dimensioned to overlay the top surface of said body;
   b. first and second leg portions of electrically conductive material in electrical circuit with said top portion and adapted to resiliently engage and electrically contact, respectively, the electrical leads of said package, each of said leg portions comprised of a plurality of individual fingers equal in number and spacing to the leads extending from one side of the package;
   c. retaining means resiliently secured to each end of said portion, each of said retaining means including a portion dimensioned to extend from said top portion to the bottom surface of the body and a tab portion for engagement with the bottom surface; and,
   d. resilient means disposed intermediate said top portion and the top surface of the body to bias said portion and the body apart, said resilient means comprised of at least one spring member formed integrally with said top portion and adapted to contact the top surface of the body.

* * * * *